（12）United States Patent
Koyama et al.

(10) Patent No.: US 8,981,859 B2
(45) Date of Patent: *Mar. 17, 2015

(54) OSCILLATOR

(71) Applicant: Canon Kabushiki Kaisha, Tokyo (JP)

(72) Inventors: Yasushi Koyama, Kamakura (JP);
Ryota Sekiguchi, Kawasaki (JP)

(73) Assignee: Canon Kabushiki Kaisha, Tokyo (JP)

( * ) Notice: Subject to any disclaimer, the term of this patent is extended or adjusted under 35 U.S.C. 154(b) by 73 days.

This patent is subject to a terminal disclaimer.

(21) Appl. No.: 13/786,164

(22) Filed: Mar. 5, 2013

(65) Prior Publication Data

US 2013/0181782 A1    Jul. 18, 2013

Related U.S. Application Data

(63) Continuation of application No. 13/256,719, filed as application No. PCT/JP2010/002019 on Mar. 23, 2010, now Pat. No. 8,410,860.

(30) Foreign Application Priority Data

Mar. 27, 2009   (JP) ................................ 2009-079402
Dec. 22, 2009   (JP) ................................ 2009-291025

(51) Int. Cl.
*H03B 7/14*          (2006.01)
*H03B 7/08*          (2006.01)

(52) U.S. Cl.
CPC ... *H03B 7/08* (2013.01); *H03B 7/14* (2013.01)
USPC ................. 331/107 T; 331/107 SL; 331/154; 343/700 MS; 257/506

(58) Field of Classification Search
USPC .......... 331/107 T, 154, 107 SL; 343/700 MS; 257/506
See application file for complete search history.

(56) References Cited

U.S. PATENT DOCUMENTS 5,511,238 A * 4/1996 Bayraktaroglu ................ 455/81

FOREIGN PATENT DOCUMENTS

EP              742639 A2   11/1996
JP         2008-011490 A    1/2008

OTHER PUBLICATIONS

Liquan Wang et al.; "A Design Procedure for Tunnel Diode Microwave Oscillators;" Ultrafast Systems Group, Nanoelectronics Research Centre, University of Glasgow, ICMMT2008 Proceedings, 2008, pp. 1-3.

(Continued)

*Primary Examiner* — Arnold Kinkead
(74) *Attorney, Agent, or Firm* — Canon USA, Inc. IP Division

(57) ABSTRACT

An oscillator includes a resonator section structured such that a dielectric is interposed between first and second conductors and such that the first and second conductors are electrically connected to a resonant tunneling diode, a capacitor section structured such that the dielectric is interposed between the first and second conductors, a line section configured to electrically connect the resonator section and the capacitor section in parallel to each other, and a resistor section configured to electrically connect the first and second conductors to each other. A first position of the resonator section and a second position of the capacitor section are connected to each other by the line section so that the first position and the second position are substantially electrically equivalent to each other in a wavelength range larger than a wavelength of an electromagnetic wave that resonates in the resonator section.

20 Claims, 6 Drawing Sheets

(56) References Cited

OTHER PUBLICATIONS

A.A. Beloushkin et al.; "Microstrip Stabilized Semiconductor Asymmetrical Quantum Well Structure Generator for Millimeter and Submillimeter Wavelength Range;" P.N. Lebedev Physical Institute, 117924, Leninsky pr. 53, Moscow, Russia, Superlattices and Microstructures; Academic Press Ltd; vol. 22, No. 1, 1997, pp. 1-5.

M. Reddy et al., "Bias Stabilization for Resonant Tunnel Diode Oscillators"; IEEE Microwave and Guided Wave Letters, vol. 5, No. 7, Jul. 1995, pp. 219-221.

* cited by examiner

OSCILLATOR

CROSS-REFERENCE TO RELATED APPLICATION

This application is a Continuation of U.S. application Ser. No. 13/256,719, now U.S. Pat. No. 8,410,860, filed Sep. 15, 2011, which is a National Phase application of International Application No. PCT/JP2010/002019, filed Mar. 23, 2010, which claims the benefit of Japanese Patent Application No. 2009-079402, filed Mar. 27, 2009 and Japanese Patent Application No. 2009-291025, filed Dec. 22, 2009, which are hereby incorporated by reference herein in their entireties.

TECHNICAL FIELD

The present invention relates to an oscillator including a resonant tunneling diode (RTD) that generates an electromagnetic wave.

BACKGROUND ART

A resonant tunneling diode (RTD) is an example of a terahertz oscillator of a current injection type that generates an electromagnetic wave in a frequency range of 30 GHz to 30 THz (referred to as terahertz wave in this description). The RTD is capable of generating the terahertz wave at a room temperature using an electromagnetic wave gain based on electron transition between subbands in a semiconductor quantum well structure.

Patent Literature 1 (Japanese Patent Laid-Open No. 2007-124250) discloses a terahertz oscillator formed by accumulating an active layer composed of a double-barrier RTD and a planar slot antenna resonator on a semiconductor substrate. The oscillator generates an electromagnetic wave by stimulated emission in a range of negative differential resistance in a current-voltage (I-V) characteristics of the RTD.

The terahertz oscillators including the RTD are well known that parasitic oscillations in bias circuit arise. The parasitic oscillation is an oscillation at a frequency other than the desired resonant frequency, which is determined by the structure of the resonator, in a terahertz frequency band. Therefore, the parasitic oscillation causes a reduction in an oscillation output at the desired resonant frequency.

Accordingly, Non Patent Literature 1 (IEEE Microwave and Guided Wave Letters, Vol. 5, No. 7, July 1995, pp 219-221) discloses a method of arranging a stabilizing circuit between a bias power supply and an RTD. The stabilizing circuit includes a resistor and a capacitor arranged in parallel to the RTD, and serves to reduce the impedance of a resonant circuit at all of the frequencies other than the resonant frequency. The stabilizing circuit is positioned within lambda/4 (lambda is a wavelength corresponding to the desired resonant frequency in the terahertz frequency range) from the RTD.

Patent Literature 1 also discloses a stabilizing circuit including a parallel resistor having the structure of a bismuth resistor and parallel capacitors having a metal-insulator-metal (MIM) layered structure. These components are integrated on the same substrate together with the RTD and the slot antenna resonator to generate an oscillation in a terahertz frequency range.

Patent Literature 2 (Japanese Patent Laid-Open No. 2006-101495) discloses a terahertz oscillator in which an RTD and a microstrip resonator (resonator including two conductors and a dielectric interposed therebetween) are integrated on the same substrate.

CITATION LIST

Patent Literature

[PTL 1] Japanese Patent Laid-Open No. 2007-124250
[PTL 2] Japanese Patent Laid-Open No. 2006-101495

Non Patent Literature

[NPL 1] IEEE Microwave and Guided Wave Letters, Vol. 5, No. 7, July 1995, pp 219-221.

SUMMARY OF INVENTION

Also in the terahertz oscillator disclosed in Patent Literature 2, the stabilizing circuit including the parallel resistor and the parallel capacitor as disclosed in Non Patent Literature 1 can be provided to suppress the parasitic oscillation.

However, according to Patent Literature 2, the structure of the resonator will be changed if the stabilizing circuit is directly positioned within lambda/4 from the RTD. Therefore, there is a risk that the oscillation output level will be reduced. In addition, there is also a risk that the pattern of the radiated electromagnetic wave will be disturbed.

In view of the above-described problems, the present invention provides a terahertz oscillator in which an RTD and a resonator such as microstrip are integrated and which can generate a stable oscillation in a terahertz frequency range.

According to an embodiment of the present invention, an oscillator for oscillating an electromagnetic wave, includes a resonator section including a resonant tunneling diode, a dielectric in contact with the resonant tunneling diode, and first and second conductors, the resonator section being structured such that the dielectric is interposed between the first and second conductors and such that the first and second conductors are electrically connected to the resonant tunneling diode; a capacitor section structured such that the dielectric is interposed between the first and second conductors; a line section configured to electrically connect the resonator section and the capacitor section in parallel to each other; and a resistor section configured to electrically connect the first and second conductors to each other. A first position of the resonator section and a second position of the capacitor section are connected to each other by the line section so that the first position and the second position are substantially electrically equivalent to each other in a wavelength range larger than a wavelength of an electromagnetic wave that resonates in the resonator section.

According to another embodiment of the present invention, an oscillating element for oscillating a terahertz wave, includes a resonator section including an active layer that generates the terahertz wave by carrier transition between subbands, first and second conductors that are electrically in contact with the active layer, and a dielectric that is interposed between the first and second conductors and in contact with the active layer; a capacitor section structured such that the dielectric is interposed between the first and second conductors; a line section configured to electrically connect the resonator section and the capacitor section in parallel to each other; and a resistor section configured to electrically connect the first and second conductors to each other. A first position of the resonator section and a second position of the capacitor section are connected to each other by the line section so that the first position and the second position are substantially electrically equivalent to each other in a wavelength range larger than a wavelength of the terahertz wave that resonates in the resonator section.

As described above, in the oscillator according to the present invention, the first position of the resonator section and the second position of the capacitor section are connected to each other by the line section. The connection is provided such that the first and second positions are substantially electrically equivalent to each other in a wavelength range that is larger than the wavelength of the electromagnetic wave that resonates in the resonator section.

This structure is substantially equivalent to the structure in which a stabilizing circuit is directly arranged on the resonator section. Accordingly, the parasitic oscillation can be suppressed in the wavelength range that is larger than the resonant wavelength (in the frequency range that is lower than the resonant frequency). Therefore, the stability of oscillation output in the terahertz frequency range can be improved.

DESCRIPTION OF EMBODIMENTS

Figure 1A:
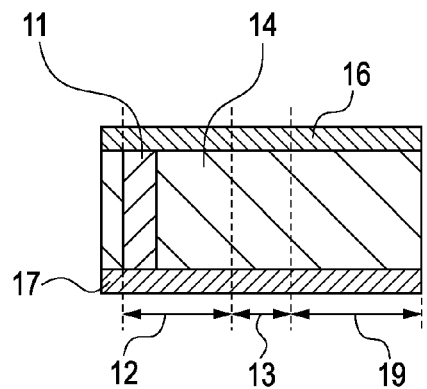
FIG. 1A is a sectional view of an oscillator according to an embodiment.
Figure 1B:
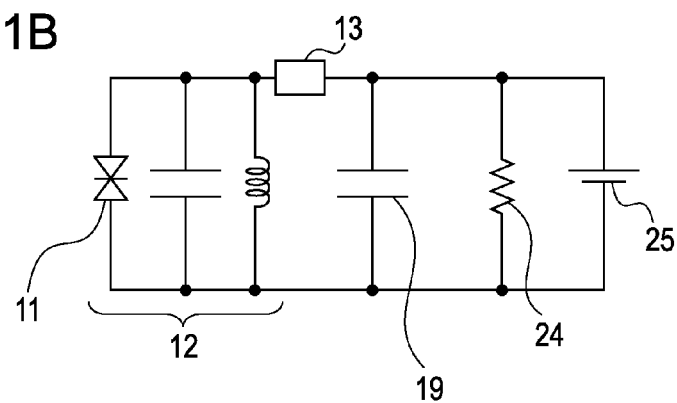
FIG. 1B is a schematic diagram illustrating a circuit equivalent to the oscillator according to the embodiment.
Figure 1C:
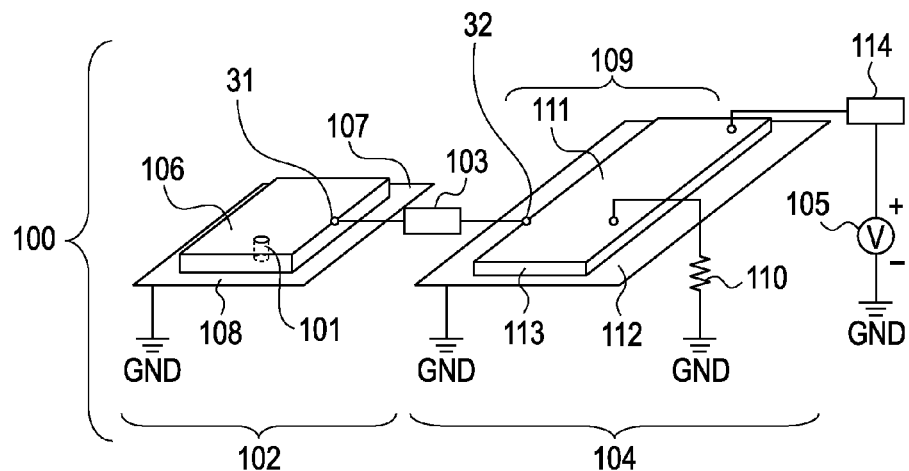
FIG. 1C is a schematic diagram illustrating the structure of an oscillator according to another embodiment.

Oscillators according to embodiments will be described with reference to FIGS. 1A to 1C. FIG. 1A is a sectional view of an oscillator according to an embodiment. FIG. 1B is a schematic diagram illustrating a circuit equivalent to the oscillator according to the embodiment. FIG. 1C is a schematic diagram illustrating the structure of an oscillator according to another embodiment. The structure of an oscillator (or an oscillating element) according to the present invention is not limited to the structures described below. The oscillator includes a resonator section 12. The resonator section 12 is structured as described below. The resonator section 12 includes a resonant tunneling diode (RTD) 11 for generating an electromagnetic wave. According to the present invention, a negative resistance device, such as a Gunn diode, can of course be used instead of the RTD as an active layer that generates the electromagnetic wave (in particular, a terahertz wave). Alternatively, according to the present invention, an active layer (for example, quantum cascade laser) that generates the electromagnetic wave by carrier transition between subbands can be used as an active layer that generates the electromagnetic wave (in particular, a terahertz wave). The resonator section 12 also includes a dielectric 14 that is in contact with the resonant tunneling diode (RTD) 11. The resonator section 12 has a structure in which the dielectric 14 is interposed between a first conductor 16 and a second conductor 17. The first conductor 16 and the second conductor 17 are electrically connected to the resonant tunneling diode (RTD) 11. The resonator section 12 can be structured such that a first dielectric 108 is interposed between a first electrode 106 and a second electrode 107, as will be described in detail below with reference to FIG. 1C.

The RTD 11 has a negative differential resistance in current-voltage characteristics thereof. The dielectric 14 interposed between the first and second conductors 16 and 17 has a capacitance C determined on the basis of the distance between the first and second conductors 16 and 17 and the cross-sectional area thereof. The dielectric 14 also has an inductance L determined on the basis of the length of the first and second conductors 16 and 17. The RTD 11 and the resonator section 12 are electrically connected in parallel to each other. A resonant circuit is formed by the RTD 11, the capacitance C, and the inductance L.

The above-described electromagnetic wave can be an electromagnetic wave in a frequency range of 30 GHz to 30 THz. Such an electromagnetic wave is referred to also as a terahertz wave in this description.

The oscillator also includes a capacitor section 19. The capacitor section 19 has a structure in which the dielectric 14 is interposed between the first and second conductors 16 and 17. The dielectric 14 interposed between the first and second conductors 16 and 17 has a capacitance determined on the basis of the distance between the first and second conductors 16 and 17 and the cross-sectional area thereof. The capacitor section 19 can be structured such that a second dielectric 113 is interposed between a third electrode 111 and a fourth electrode 112, as will be described in detail below with reference to FIG. 1C.

The oscillator also includes a line section 13. The line section 13 is structured such that the resonator section 12 and the capacitor section 19 are electrically connected in parallel to each other.

A resistor section 24 is provided to be electrically parallel to the capacitor section 19. The resistor section 24 is electrically connected to the first conductor 16 and the second conductor 17.

A first position 31 (port 1) of the resonator section 12 and a second position 32 (port 2) of the capacitor section 19 are connected to each other by the line section 13. The connection is provided such that the first and second positions 31 and 32 are electrically equivalent to each other in a wavelength range that is larger than the wavelength of the electromagnetic wave (standing wave) that resonates in the resonator section 12. This structure is substantially equivalent to the structure in which a stabilizing circuit is directly arranged on the resonator section.

Accordingly, the parasitic oscillation can be suppressed in the wavelength range that is larger than the resonant wavelength (in the frequency range that is lower than the resonant frequency). Therefore, the stability of oscillation output in the terahertz frequency range can be improved. In addition, in the oscillator according to the embodiment of the present invention, the frequency range in which oscillation can be generated can be adjusted by adjusting the length of the line section 13 and the capacity of the capacitor section 19.

The first position 31 on the first electrode 106 in the resonator section 12 and the second position 32 on the third electrode 111 in the capacitor section 19 can be connected to each other by the line section 13, as will be described in detail below with reference to FIG. 1C.

The line section 13 can be a quarter lambda line. The quarter lambda line is a line having a length substantially equal to lambda/4, where lambda is a wavelength of the resonating electromagnetic wave (standing wave) that resonates in the resonator section 12. Lambda can be a wavelength corresponding to the desired oscillation frequency. In the case where the line section 13 is a quarter lambda line, the line section 13 can be connected to the resonator section 12 at an arbitrary position thereof. The first position 31 (port 1) can be located at a node of the standing wave that resonates in the resonator section 12. In such a case, the length of the line section 13 can be set to an arbitrary length.

As in the embodiment described below with reference to FIG. 1C, the first conductor 16 can be constituted by different conductors (the first electrode 106, the third electrode 111, and a line 103). Thus, the first conductor 16 is not particularly limited as long as it is electrically uniform between the resonator section 12, the capacitor section 19, and the line section 13. The resistor section 24 is preferably disposed at the outer periphery of the third electrode 111 in the capacitor section 19. The third electrode 111 in the capacitor section 19 can be structured so as to surround the first electrode 106 in the resonator section 12 along the plane in which the resonator section 12 is disposed. In addition, a plurality of line sections 13 can be provided, and the line sections 13 can be arranged symmetrically to each other with respect to the resonator section 12. In addition, a power supply 25 that applies a voltage to the RTD 11 and a feeder line 114 that electrically connects the power supply 25 to the second position 32 can be provided. The resonator section 12 can include a patch antenna. These structures will be described in detail below with reference to FIG. 1C. The oscillator according to the present invention can also be structured such that the oscillator generates an electromagnetic wave as a high-frequency signal instead of radiating the electromagnetic wave into the space.

An oscillator 100 according to another embodiment will be described with reference to FIG. 1C. The oscillator 100 mainly includes an RTD 101, a resonator 102, the line 103, a stabilizing circuit 104, and a bias power supply 105.

In the oscillator 100 according to the present embodiment, the resonator 102 includes two electrodes and a dielectric interposed therebetween. The first electrode 106 in the resonator 102 and the third electrode 111 in a capacitor section 109 are connected to each other by the line 103 at a node of the standing wave that resonates in the resonator 102. Accordingly, port 2, which is electrically equivalent to port 1 on the first electrode 106 in a wavelength range larger than the resonant wavelength lambda, appears on the third electrode 111. A parallel resistor section 110 is connected to port 2. This is substantially equivalent to the state in which the stabilizing circuit 104 into port 1. Since the line 103 is provided, the stabilizing circuit 104 does not cause a loss in the standing wave that resonates in the resonator 102. First, the resonator 102 (resonator section 12) will be described. The resonator 102 includes the first electrode 106, the second electrode 107, and the first dielectric 108. The first dielectric 108 is interposed between the first electrode 106 and the second electrode 107, and an electromagnetic wave in the first dielectric 108 forms a standing wave. The RTD 101 is, for example, disposed in the first dielectric 108, and is electrically connected to the first electrode 106 and the second electrode 107 so that a bias is provided. The electrodes 106 and 107 can be composed of conductive plates (good conductors) and are desirably composed of metal plates.

The stabilizing circuit 104 includes the capacitor section 109 (capacitor section 19) and the parallel resistor section 110 (resistor section). The capacitor section 109 includes the third electrode 111, the fourth electrode 112, and a second dielectric 113. The second dielectric 113 is interposed between the third electrode 111 and the fourth electrode 112, and the capacitor section 109 has a metal-insulator-metal (MIM) capacitor structure in which a metal layer, a dielectric layer, and a metal layer are stacked together in that order. The capacitance of the capacitor section 109 is desired to be as large as possible. Therefore, the second dielectric 113 can be made of a material having a high dielectric constant and a small thickness. The second electrode 107 and the fourth electrode 112 have the same electrostatic potential, and are grounded in the present embodiment. The parallel resistor section 110 is a resistor having linear or non-linear resistance characteristics in the current-voltage characteristics. One end of the parallel resistor section 110 is connected to the third electrode 111, and the other end thereof is grounded. One end of the bias power supply 105 (power supply 25) is connected to the third electrode 111 by the feeder line 114, and the other end thereof is grounded.

To supply a bias to the RTD 101, it is necessary to connect the bias power supply 105 to the first electrode 106 in the resonator 102. In this case, it is required that no loss is caused in the resonant electromagnetic field in the resonator 102 and no interference with the pattern of the radiated electromagnetic wave occurs. Non Patent Literature 1 discloses a structure of a stabilizing circuit in which the parallel capacitor and the parallel resistor are disposed between the RTD 101 and the bias power supply 105.

According to the oscillator of the present embodiment, the above-described requirements are satisfied by electrically connecting the resonator 102 and the capacitor section 109 to each other by the line 103. One end of the line 103 is connected to port 1 on the first electrode 106 where a node of the standing wave in an electromagnetic field that resonates in the resonator 102 is located. The other end of the line 103 is connected to port 2 on the third electrode 111 of the capacitor section 109.

The length L of the line 103 can be lambda/4 (quarter lambda line). In such a case, leakage of a high-frequency wave from the antenna resonator can be effectively reduced. In addition, a series resistance component of the RTD 101 can be reduced.

This can be understood from an admittance $Y_{11}$ of port 1, which can be calculated as follows.

(Math. 1)

$$Y_{11} = Y_{103}(Y_{22} + jY_{103}\tan(\beta \cdot L))/(Y_{103} + jY_{22}\tan(\beta \cdot L)) \quad (1)$$

In the above expression, beta is 2*pi/lambda, and $Y_{103}$ is the characteristic admittance of the line 103. An admittance $Y_{22}$ of port 2 can be determined as a combined admittance of the capacitor section 109 and the parallel resistor section 110. According to the solution of Expression (1), port 1 and port 2 are substantially electrically equivalent to each other in a wavelength range larger than the resonant wavelength, and the structure is substantially equivalent to that in which the stabilizing circuit 104 is connected to port 1. As is clear from an example of an analysis result shown in FIG. 3A, $Y_{11}$ is at a minimum when the length L of the line 103 is, for example, exactly equal to lambda/4. Therefore, no loss is caused by the stabilizing circuit 104 in the resonant electromagnetic field in the resonator 102. In this case, it is not necessary to reduce the loss level to zero as long as the loss level is equal to or less than a certain level. Therefore, the length L of the line 103 can be set to a length close to lambda/4. In addition to lambda/4, the length L may also be set to 3*lambda/4, 5*lambda/4, etc., which are obtained by multiplying lambda/4 by (2m−1), where m is a natural number. In addition, if port 1 is at a node of the standing wave in the electromagnetic field that resonates in the resonator 102, the length of the line 103 can be set to an arbitrary length. For example, the parasitic oscillation at a high frequency (lambda) can be suppressed when the length L is set to about lambda$_2$/2. Here, lambda is the wavelength of the standing wave, and lambda$_2$ is a wavelength of the electromagnetic wave that resonates in the resonator 102 and satisfies lambda$_2$<lambda. In addition to lambda$_2$/2, the length L may also be set to lambda$_2$, 3*lambda$_2$/2, etc., which are obtained by multiplying lambda$_2$/2 by n, which is a natural number. The width of the line 103 is set such that the characteristic impedance of the line 103 can be increased and the line 103 does not serve as a large series resistance for the RTD 101.

In the wavelength range larger than the resonant wavelength (lambda), port 2 is expanded to the entire area of the third electrode 111, owing to the capacitor section 109. Therefore, in the present embodiment, for example, the parallel resistor section 110 and the feeder line 114 can be connected to the third electrode 111 at arbitrary positions on the third electrode 111. If the parallel resistor section 110 and the feeder line 114 can be arranged at arbitrary positions on the third electrode 111, the stabilizing circuit 104 and lead wires from the bias power supply 105 can be easily arranged in the oscillator 100.

According to Non Patent Literature 1, the resistance of the parallel resistor can be equal to or slightly smaller than the absolute value of the negative differential resistance. More specifically, the resistance can be set to several ohms to several tens of ohms. To obtain such a resistance from a relatively stable resistor, such as a metal or an alloy, the size of the resistor is set in the order of several tens to several hundreds of micrometers. Thus, the size of the parallel resistor is close to the size of the resonator 102 (in the order of 100 micrometers). If the parallel resistor section 110 is disposed near the RTD 101, there is a high possibility that an interference with the pattern of the radiated electromagnetic wave will occur. Since the resistance of a parallel resistor is relatively low, the parallel resistor generates heat when a current flows therethrough in the oscillating operation. Therefore, if the parallel resistor section 110 is disposed near the RTD 101, there is a possibility that the characteristics of the RTD 101 will be changed by heat. In addition, because of the scales of the components, it is difficult to directly connect the lead line for supplying a bias to the resonator 102 while minimizing the loss in the resonant electromagnetic wave in the resonator 102. However, in the oscillating operation, it is essential to supply a bias from the bias power supply 105 to the RTD 101 that serves as the oscillation source.

In the oscillator 100 according to the present embodiment, the resonator 102 and the capacitor section 109 are connected to each other by the line 103, so that the connecting points of the parallel resistor section 110 and the feeder line 114 can be expanded to the entire area of the third electrode 111. This allows versatile layout without causing an interference with the pattern of the radiated electromagnetic wave. For example, even when the parallel resistor section 110 is relatively large and has a relatively low resistance, the parallel resistor section 110 can be arranged at the outer periphery of the third electrode 111 at a position distant from the RTD 101. As a result, the parasitic oscillation can be suppressed without causing the RTD 101 to be influenced by heat, and the stability of the oscillating operation can be improved.

Thus, according to the structure of the oscillator 100 of the present embodiment, although the resonator is composed of two electrodes and a dielectric, the stabilizing circuit 104 can be provided while minimizing the loss in the resonant electromagnetic field and the interference with the pattern of the radiated electromagnetic wave. Therefore, a bias can be supplied from the bias power supply 105 to the RTD 101 in the resonator 102, and the parasitic oscillation can be suppressed by the stabilizing circuit 104. As a result, the oscillator 100 of the present embodiment is capable of performing an oscillating operation in the terahertz range.

The resonator 102 can be shaped such that the third electrode 111 surrounds the first electrode 106. Alternatively, a portion of the first conductor 16 in the capacitor section 19 can be arranged so as to surround a portion of the first conductor 16 in the resonator section 12 along the plane in which the resonator section 12 is disposed. In such a case, the electromagnetic wave can be emitted from the resonator in a shaped state.

In addition, a plurality of lines 103 (line section 13) can be provided, and the lines 103 can be arranged symmetrically to each other with respect to the resonator 102 in the left-right direction. The resonator 102 is not particularly limited as long as the resonator 102 includes two electrodes and a dielectric interposed therebetween. For example, a microstrip resonator, a patch antenna, etc., can be used.

EXAMPLES

Examples of the present invention will now be described in detail.

First Example

Figure 2A:
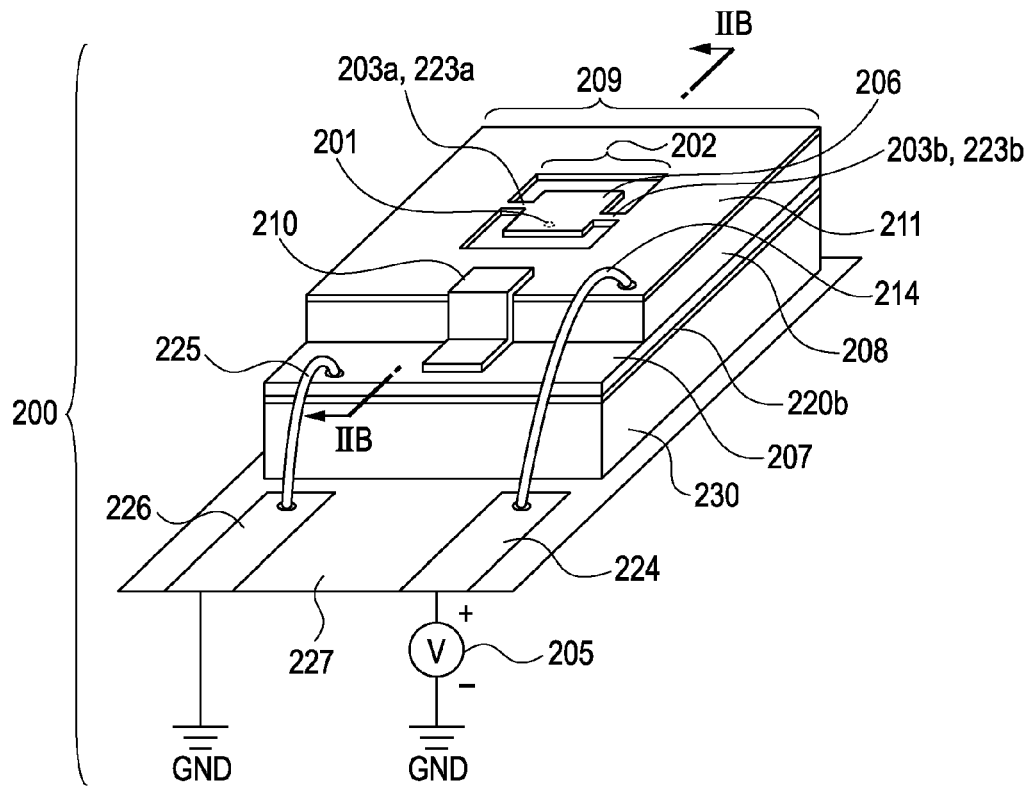
FIG. 2A is an external view illustrating a first example.
Figure 2B:
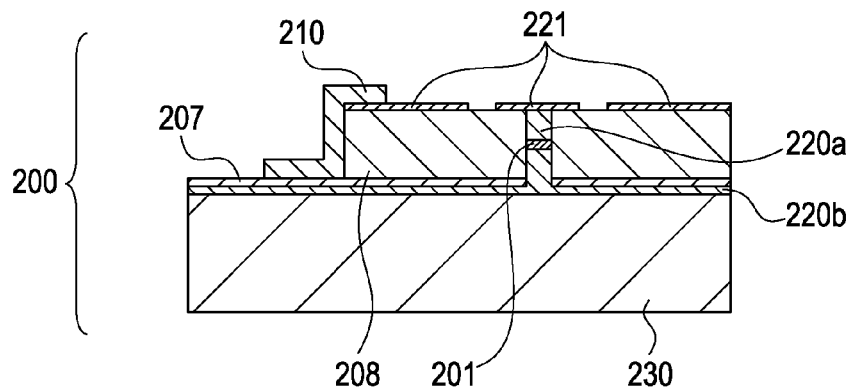
FIG. 2B is a sectional view of FIG. 2A taken along line IIB-IIV.
Figure 3A:
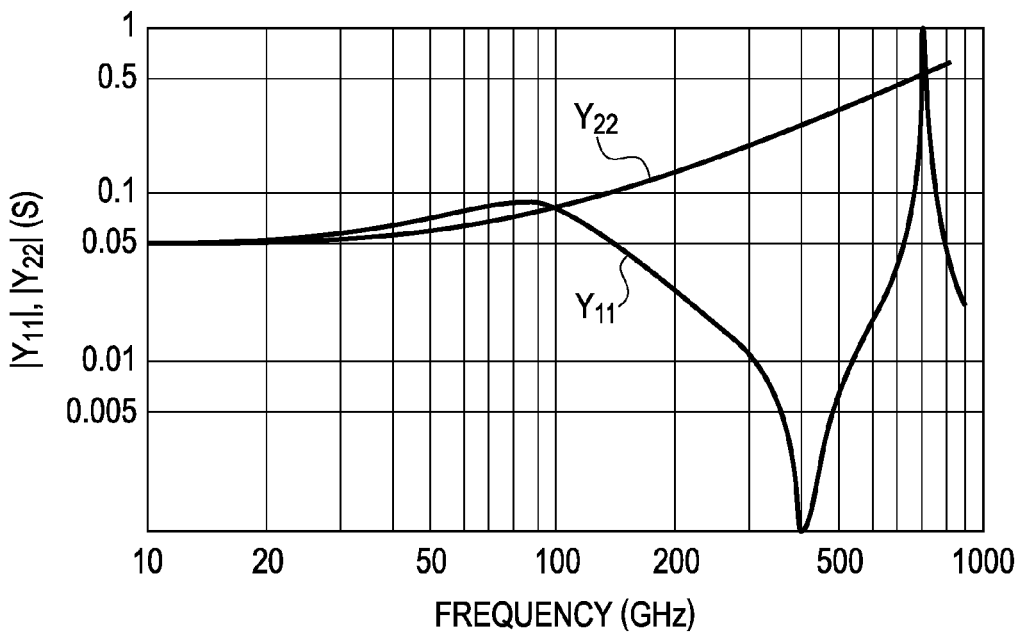
FIG. 3A is a graph illustrating an example of the result of admittance analysis.
Figure 3B:
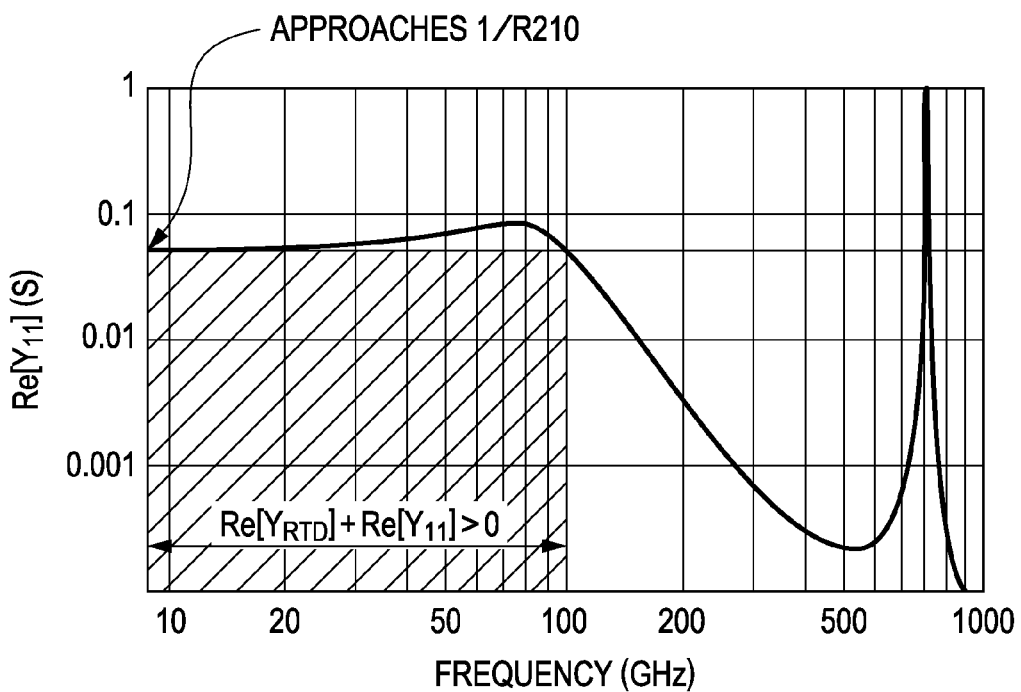
FIG. 3B is another graph illustrating an example of the result of admittance analysis.
Figure 4A:
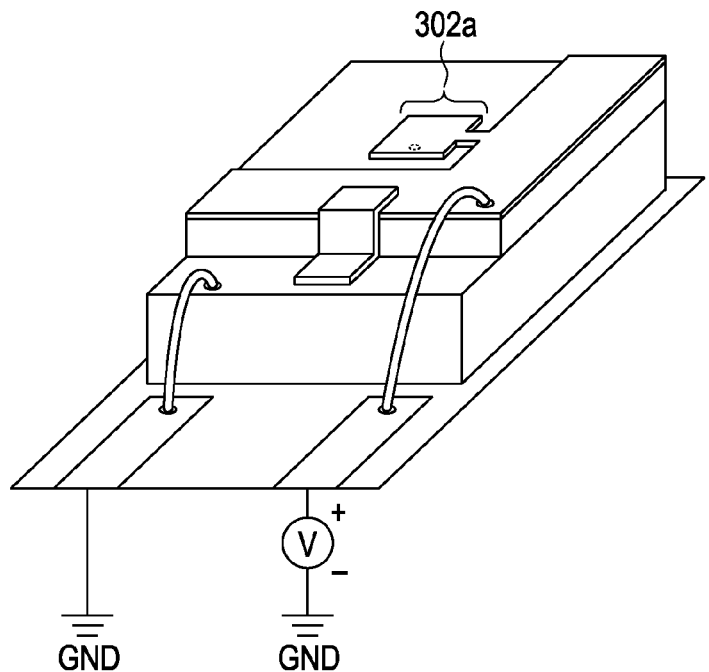
FIG. 4A is an external view illustrating a modification of the oscillator according to the first example.
Figure 4B:
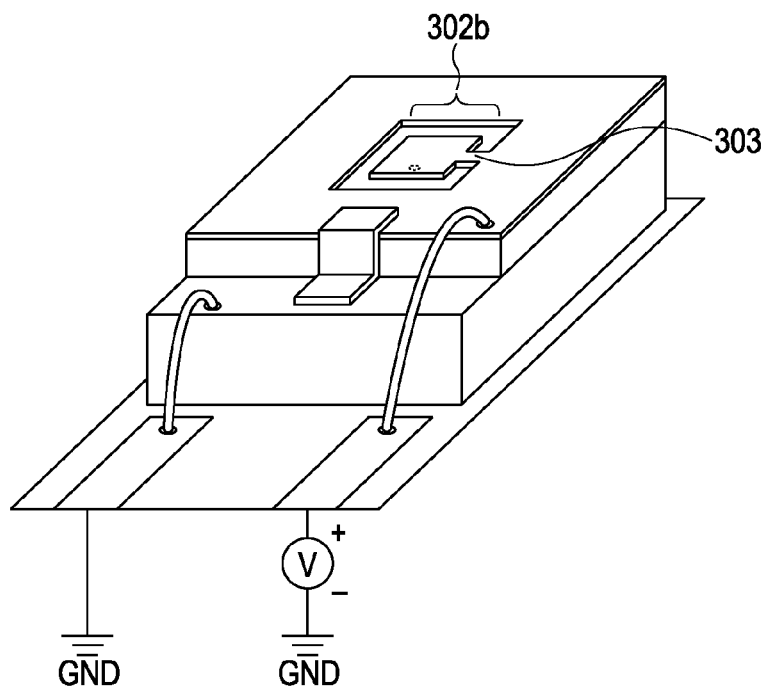
FIG. 4B is an external view illustrating another modification of the oscillator according to the first example.

An oscillator according to a first example will be described with reference to FIGS. 2A to 4B. FIG. 2A is an external view illustrating the first example. FIG. 2B is a sectional view illustrating the first example. FIGS. 3A and 3B are graphs illustrating an example the result of admittance analysis of the oscillator according to the first example. FIGS. 4A and 4B are external views illustrating modifications of the first example.

The structure of an oscillator 200 according to the first example will now be described. The oscillator 200 according to the first example is a terahertz oscillator formed on a substrate 230 and is mainly composed of an RTD 201, a patch antenna resonator 202, lines 203a and 203b, an MIM structure 209, and a bismuth resistor 210.

The RTD 201 has a triple-barrier quantum well structure.
First Barrier Layer: AlAs, 1.3 nm
First Quantum Well Layer: InGaAs, 7.6 nm
Second Barrier Layer: InAlAs, 2.6 nm
Second Quantum Well Layer: InGaAs, 5.6 nm
Third Barrier Layer: AlAs, 1.3 nm The first quantum well layer, the second barrier layer, and the second quantum well layer are made of InGaAs/InAlAs (not shown) that are lattice-matched to an InP (100) surface. The first barrier layer and the third barrier layer are made of AlAs that is not lattice-matched to InP. The first and third barrier layers are thinner than a critical film, and serve as high-energy barriers. The triple-barrier quantum well structure is sandwiched from above and below by spacer layers (not shown) made of non-doped InGaAs and electric contact layers (not shown) made of n+InGaAs. In addition, the thus-obtained structure is sandwiched from above and below by contact layers 220a and 220b made of heavily doped n++In- GaAs. Thus, the RTD 201 is obtained. The RTD 201 has a mesa structure with a diameter of about 2 micrometers, and is formed by an ICP-RIE method using chlorinated pesticide. The RTD 201 is electrically connected at upper and lower sections thereof to a first electrode 206, which is a part of an upper electrode layer 221, and a GND electrode 207 connected to the contact layer 220*b*. Accordingly, a bias that is necessary for the oscillating operation can be supplied to the RTD 201. Owing to the photon-assisted tunneling phenomenon, the RTD 201 according to the first example provides current-voltage characteristics in which the current density is $J_p=280$ kA/cm$^2$, the peak-to-valley ratio is about 3, and the negative differential resistance is about −22 ohms.

The patch antenna resonator 202 according to the first example is capable of efficiently emitting a terahertz wave to the space, and the resonator structure of the patch antenna resonator 202 is advantageous in the case of producing arrayed resonators or high-output-level resonators. In the patch antenna resonator 202, factors that determine the oscillation frequency include the parameters of the material and structure, such as the type and thickness of the dielectric material, the length of each side of the patch antenna, and the size and position of the RTD. The patch antenna resonator 202 includes the first electrode 206, the GND electrode 207, and a dielectric layer 208. The dielectric layer 208 is interposed between the first electrode 206 and the GND electrode 207, and a standing electromagnetic wave is formed in the dielectric between the first electrode 206 and the GND electrode 207. The first electrode 206 is a part of the upper electrode layer 221, and is formed as a conductive patch in a pattern of a 150×150 micrometer square. The RTD 201 is embedded in the dielectric layer 208, and is sandwiched from above and below by the first electrode 206 and the GND electrode 207. The RTD 201 is disposed at a position displaced from the center of the first electrode 206 by 40 micrometers along line IIB-IIB, so that impedance matching is achieved between the patch antenna resonator 202 and the RTD 201.

The upper electrode layer 221 is composed of metal layers of Ti/Pd/Au (20 nm/20 nm/200 nm) formed by a lift-off method, and is known as a low-resistance ohmic electrode on heavily doped n++InGaAs. In the first example, the first electrode 206, a third electrode 211, a layer section 223*a*, and a layer section 223*b* are formed integrally with each other in the upper electrode layer 221.

The dielectric layer 208 is made of benzocyclobutene (BCB), which is known as a low-loss material for high-frequency electromagnetic waves. The dielectric layer 208 has a thickness of 3 micrometers, and is formed by spin-coating and dry etching. The dielectric layer 208 serves to insulate the upper electrode layer 221 and the GND electrode 207 from each other for a direct current. In the first example, components corresponding to the first dielectric 108 in the resonator 102, the second dielectric 113 in the capacitor, and a dielectric (not shown) in the line 103 shown in FIG. 1C are formed integrally with each other in the dielectric layer 208. The GND electrode 207 is composed of metal layers of Ti/Pd/Au/Ti (20 nm/20 nm/200 nm/20 nm) formed by a lift-off method. The GND electrode 207 corresponds to the second electrode 107 and the fourth electrode 112 having the same potential shown in FIG. 1C, and is grounded. The GND electrode 207 is connected to a GND line 226 arranged on, for example, a printed board 227 through a GND line 225 formed by wire bonding.

In the oscillator 200 according to the first example, the oscillation frequency of the patch antenna resonator 202 having a lambda/2 patch is about 0.4 THz. The lines 203*a* and 203*b* are microstrip lines in which the dielectric layer 208 is interposed between the GND electrode 207 and the layer sections 223*a* and 223*b* formed in a certain pattern in the upper electrode layer 221. Each of the layer sections 223*a* and 223*b* is formed in a pattern of a 12×75 micrometer rectangle, that is, in such a shape that the lines 203*a* and 203*b*, which are microstrip lines, serve as quarter lambda lines with respect to the oscillation frequency of 0.4 THz. In the first example, the layer sections 223*a* and 223*b* are connected to the first electrode 206 at substantially central positions thereof, so that the lines 203*a* and 203*b* are disposed at positions corresponding to nodes of the standing wave of the resonant electromagnetic field. Since the lines 203*a* and 203*b* are arranged symmetrically to each other with respect to the patch antenna resonator 202 in the left-right direction, the wiring resistance can be reduced.

The MIM structure 209 corresponds to the capacitor section 109 in FIG. 1C, and is composed of the third electrode 211, the GND electrode 207, and the dielectric layer 208. The MIM structure 209 is formed such that the dielectric layer 208 is interposed between the third electrode 211 and the GND electrode 207. The third electrode 211 is a part of the upper electrode layer 221, and is formed in a pattern such that a 300×300 micrometer square is cut out from a 1,200×2,000 micrometer rectangle to obtain a capacitance of several pF. The shape of the third electrode 211 is adequately designed in accordance with the capacitance of the MIM structure 209 and the shape of the antenna in the patch antenna resonator 202. In the case where the third electrode 211 is arranged such that the third electrode 211 is symmetrically with respect to the patch antenna resonator 202 in the left-right direction and such that the third electrode 211 surrounds the patch antenna resonator 202 as in the first example, an unbalanced influence of the components on the pattern of the electromagnetic wave radiated from the patch antenna can be suppressed and the electromagnetic wave pattern can be more suitably shaped.

In the first example, the bismuth resistor (parallel resistor) 210 corresponds to the parallel resistor section 110 in FIG. 1C. The bismuth resistor 210 is connected to an outer peripheral section of the third electrode 211 at one end thereof and to the GND electrode 207 at the other end thereof. The bismuth resistor 210 is made of bismuth, which is a semimetal. To obtain a resistance of 20 ohms, a 200×200 micrometer bismuth film with a thickness of 1 micrometer is formed by a lift-off method. The parallel resistor may also be a linear resistor made of a metal, such as nickel chrome, a conductive resin, etc., or a non-linear resistor made of a semiconductor. One end of a feeder line 214 formed by wire bonding is connected to the third electrode 211 at a suitable position, and the other end is connected to a signal line 224 on the printed board 227.

FIGS. 3A and 3B show the result of analysis of admittances $Y_{11}$ and $Y_{22}$ at port 1 and port 2, respectively, in the structure of the above-described first example. As shown in FIG. 3A, port 1 and port 2 are electrically equivalent to each other in a frequency range of 20 GHz or less. Namely, within the range of 20 GHz or less, the structure of the first example is equivalent to the structure in which a stabilizing circuit is connected to port 1. In addition, since the length L of the lines 203*a* and 203*b* is lambda/4, the magnitude of the admittance $Y_{11}$ is at a minimum and can be ignored when the frequency is equal to the oscillation frequency, that is, 0.4 THz. In the case where the length L of the lines 203*a* and 203*b* and the capacitance of the MIM structure (capacitor section) 209 are adjusted as in the first example, the frequency range in which the parasitic oscillation can be suppressed is equal to or less than 0.1 THz. This is because when the frequency is equal to or less than 0.1 THz, the admittance $Y_{11}$ and the parallel resonant circuit in the RTD 201 satisfy the following condition (parasitic-oscillation suppressing condition) under which the parasitic oscillation can be suppressed.

(Math. 2)

$$Re[Y_{RTD}]+Re[Y_{11}]>0 \qquad (2)$$

In the above expression, $Re[Y_{RTD}]$ is the real part of the admittance of the RTD 201, and is equal to the reciprocal of the negative resistance, that is, $1/-22$ ohms$^{-1}$ in the first example. As is clear from Expression (1), as the capacitance increases, the maximum frequency that satisfies the parasitic-oscillation suppressing condition decreases. In addition, as the length L of the lines 203a and 203b increases, the maximum frequency that satisfies the parasitic-oscillation suppressing condition decreases. However, the length L has an upper limit of lambda/2. As described above, according to the oscillator of the present invention, the frequency range in which oscillation can be generated and the frequency range for which oscillation is to be suppressed can be adjusted.

In the oscillator 200 shown in FIGS. 2A and 2B, the bias is successively supplied from a bias power supply 205 to the signal line 224, the feeder line 214, the third electrode 211, the lines 203a and 203b, the first electrode 206, and the RTD 201 in that order. At this time, loss in the components necessary for feeding the electricity and in the resonant electromagnetic field in the patch antenna resonator 202 are minimized. In addition, the stabilizing circuit serves to suppress the parasitic oscillation in the resonant circuit including the RTD 201 and the patch antenna resonator 202.

As described above, the oscillator 200 according to the first example is structured such that the stabilizing circuit can be integrated with the RTD 201 and the patch antenna resonator 202 while minimizing the loss in the resonant electromagnetic field. Therefore, the oscillator 200 according to the first example is capable of suppressing the parasitic oscillation and performing an oscillating operation in the terahertz range.

As a modification of the first example, FIG. 4A shows the structure in which a patch antenna resonator 302a is not surrounded by the MIM structure 209. In addition, FIG. 4B shows the structure in which a patch antenna resonator 302b is connected to a single line 303.

Figure 6A:
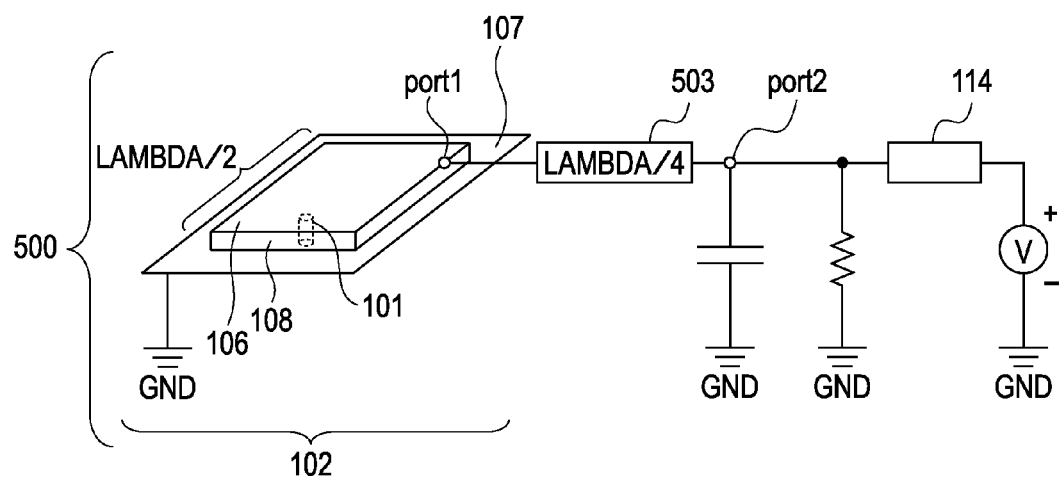
FIG. 6A is a schematic diagram illustrating another modification of the oscillator according to the first example.
Figure 6B:
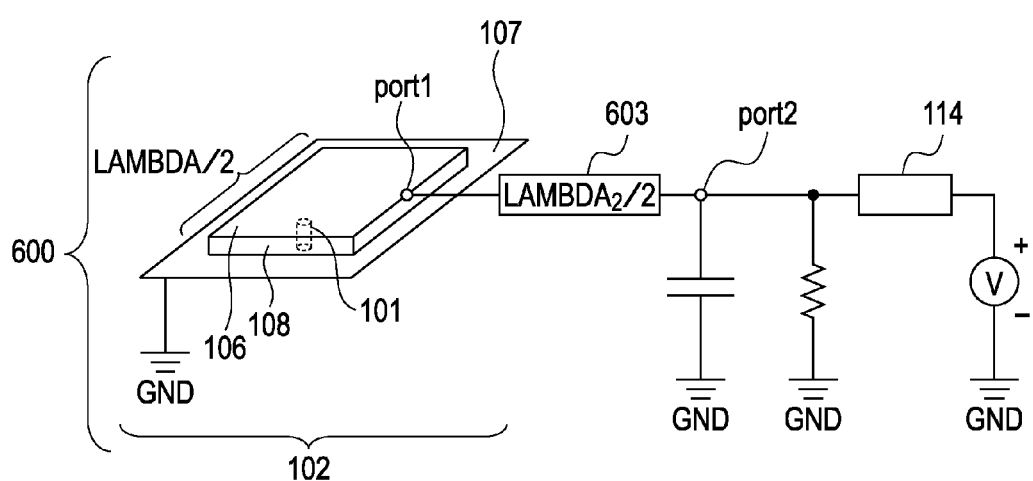
FIG. 6B is a schematic diagram illustrating another modification of the oscillator according to the first example.

In addition, as in an oscillator 500 shown in FIG. 6A, a line 503 may be formed as a quarter lambda line and be connected to a resonator 102 at an arbitrary position. In this case, as shown in FIG. 3A, which is an example of the result of admittance analysis, the admittance is reduced to a relative minimum at a period of $(2m-1)*lambda/4$, where m is a natural number, and therefore the stabilizing circuit does not serve as a loss in the standing wave in the resonator. In addition, as in an oscillator 600 shown in FIG. 6B, a line 607 with a line length of about $lambda_2/2$ may be arranged at a node of the standing wave (wavelength lambda) in the electromagnetic field that resonates in the resonator 102. As a typical example, $lambda_2$ (or lambda') is the wavelength of the electromagnetic wave at a high-order resonant point among electromagnetic waves that resonate in the resonator 102. In addition, lambda (or lambda) is the wavelength of the electromagnetic wave at a basic resonant point among the electromagnetic waves that resonate in the resonator 102, and $lambda_2<lambda$ is satisfied. In this case, as is shown in FIGS. 3A and 3B, which are an example of the result of admittance analysis, the admittance increases at a period of $n*lambda_2/2$ (n is a natural number) and Expression (2) is satisfied even at a frequency ($lambda_2$) that is higher than lambda. Therefore, high-order oscillation that is specific to the resonator 102 can be suppressed.

As another example of a resonator including two electrodes and a dielectric interposed therebetween, a slot antenna resonator may also be used, which is suitable for the case where the frequency of the oscillator according to the first example is to be increased. In addition, in the case where a plurality of oscillators having the structure according to the present invention are arranged in an array on a single substrate, an oscillator that can generate a terahertz electromagnetic wave at a higher output level can be provided. Such a structure can be produced by a known semiconductor process.

In the first example, a triple-barrier resonant tunneling diode including layers made of InGaAs/InAlAs and InGaAs/AlAs formed on an InP substrate is used as the RTD 201. However, the structure and materials are not limited to the above-described example, and the semiconductor element according to the present invention may also be a combination of other structures and materials. For example, a resonant tunneling diode having a double-barrier quantum well structure or a resonant tunneling diode having a multi-barrier quantum well structure with four or more barriers may also be used. With regard to the materials, GaAs/AlGaAs, GaAs/AlAs, or InGaAs/GaAs/AlAs formed on a GaAs substrate, InGaAs/AlGaAsSb formed on an InP substrate, InAs/AlAsSb or InAs/AlSb formed on an InAs substrate, SiGe/SiGe formed on a Si substrate, etc., may be used in combination. The structures and materials may be adequately selected in accordance with the desired frequency or the like. In the above description of the present invention, it is assumed that the carriers are electrons. However, the present invention is not limited to this, and the carriers may also be holes. In addition, the material of the substrate 230 can be selected in accordance with the application thereof. For example, a semiconductor substrate, such as a silicon substrate, a gallium arsenide substrate, an indium arsenide substrate, or a gallium phosphide substrate, a glass substrate, a ceramic substrate, a resin substrate, etc., may also be used.

Second Example

Figure 5A:
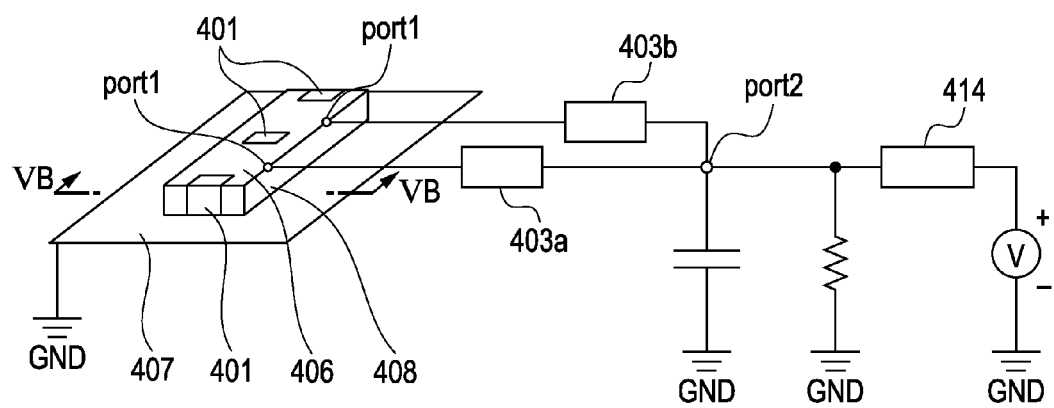
FIG. 5A is a schematic diagram illustrating an oscillator according to a second example.
Figure 5B:
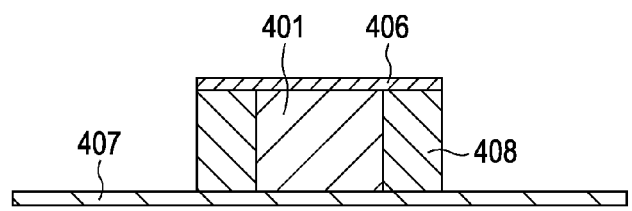
FIG. 5B is a sectional view of FIG. 5A taken along line VB-VB.

A second example, in which the resonator has a waveguide structure, will be described with reference to FIGS. 5A and 5B. An oscillator according to the second example includes a resonator having a plasmon waveguide structure. The plasmon waveguide structure is structured such that RTDs 401 are disposed in a resonator including two electrodes 406 and 407 and a dielectric layer 408 interposed therebetween. According to the second example, the output level of the oscillator can be increased. In FIGS. 5A and 5B, reference numeral 414 denotes a feeder line.

The RTDs 401 may be formed continuously in a direction perpendicular to the figures (not shown). In addition, as shown in FIGS. 5A and 5B, the RTDs 401 may be periodically arranged in the resonator. In this case, the oscillator according to the second example can be structured such that a plurality of lines (for example, lines 403a and 403b) are connected to respective ports 1 at which nodes of the standing wave that resonates in the electromagnetic field are located. As a typical example, the lines can include a first line for suppressing the electromagnetic wave in a wavelength range larger than the wavelength lambda of the electromagnetic wave at a basic resonant point and a second line (different from the first line) for suppressing the electromagnetic wave with a wavelength lambda' (which is lower than lambda) at a high-order resonant point. At this time, the length of the first line is close to $(2m-1)\cdot lambda/4$ (m is a natural number), and the length of the second line is close to $n*lambda'/2$ (n is a

The invention claimed is:

1. An oscillator for oscillating an electromagnetic wave, comprising:
   a resonator section including a first electrode, a second electrode, a first dielectric disposed between the first electrode and the second electrode and a negative resistance device electrically connected to the first electrode and the second electrode, and configured to resonate the electromagnetic wave;
   a capacitor section including a third electrode, a fourth electrode and a second dielectric disposed between the third electrode and the fourth electrode;
   a line section configured to be electrically connected to the first electrode and the third electrode; and
   a resistor configured to be electrically connected to the third electrode and the fourth electrode.

2. The oscillator according to claim 1,
   wherein the line section is connected to a first position of the first electrode and a second position of the third electrode, and
   wherein the first position and the second position are substantially electrically equivalent to each other in at least a part of a wavelength range larger than a wavelength of the electromagnetic wave.

3. The oscillator according to claim 1,
   wherein the line section is connected to a first position of the first electrode and a second position of the third electrode, and
   wherein an admittance of the first position and an admittance of the second position are substantially equivalent to each other in at least a part of a wavelength range larger than a wavelength of the electromagnetic wave.

4. The oscillator according to claim 1,
   wherein the line section is connected to a position, on the first electrode, corresponding to a node of a standing wave which is resonated by the resonator section.

5. The oscillator according to claim 1,
   wherein, when lambda is a wavelength of the electromagnetic wave that resonates in the resonator section, a length of the line section is close to (2m−1)·lambda/4, where m is a natural number.

6. The oscillator according to claim 1,
   wherein, when lambda' is a wavelength smaller than a wavelength of the electromagnetic wave that resonates in the resonator section, a length of the line section is close to n·lambda'/2, where n is a natural number.

7. The oscillator according to claim 1, wherein the resistor is disposed at an outer periphery of the third electrode.

8. The oscillator according to claim 1, wherein the third electrode is arranged so as to surround the first electrode.

9. The oscillator according to claim 1, wherein the oscillator includes a plurality of line sections.

10. The oscillator according to claim 9, wherein the plurality of line sections is arranged symmetrically to each other with respect to the resonator section.

11. The oscillator according to claim 1, further comprising:
    a power supply configured to apply a voltage to the negative resistance device; and
    a feeder line section configured to be electrically connected to the third electrode and the power supply.

12. The oscillator according to claim 1, wherein the electromagnetic wave includes a terahertz wave.

13. The oscillator according to claim 1, wherein the resonator section includes a patch antenna.

14. The oscillator according to claim 1, wherein the capacitor section is connected electrically in parallel to the negative resistance device.

15. The oscillator according to claim 1, wherein the resistor is connected electrically in parallel to the negative resistance device.

16. The oscillator according to claim 1, wherein the negative resistance device includes a resonant tunneling diode.

17. The oscillator according to claim 1, wherein the first electrode and the third electrode are formed integrally with each other.

18. The oscillator according to claim 1, wherein the second electrode and the fourth electrode are formed integrally with each other.

19. The oscillator according to claim 1, wherein the first dielectric and the second dielectric are formed integrally with each other.

20. The oscillator according to claim 1, wherein, in a wavelength range that is larger than the wavelength of the electromagnetic wave, a first position on the first electrode of the resonator section and a second position on the third electrode of the capacitor section are connected via the line section such that a formula $Re[Y_{RTD}]+Re[Y_{11}]>0$ is satisfied, wherein $Re[Y_{RTD}]$ is a real part of an admittance of a resonant tunneling diode, and $Re[Y_{11}]$ is a real part of the admittance at the first position of the resonator section.

* * * * *